July 7, 1964 R. L. CHASE 3,140,479
TRANSISTORIZED ANALOG-TO-DIGITAL CONVERTER
Filed Feb. 4, 1960
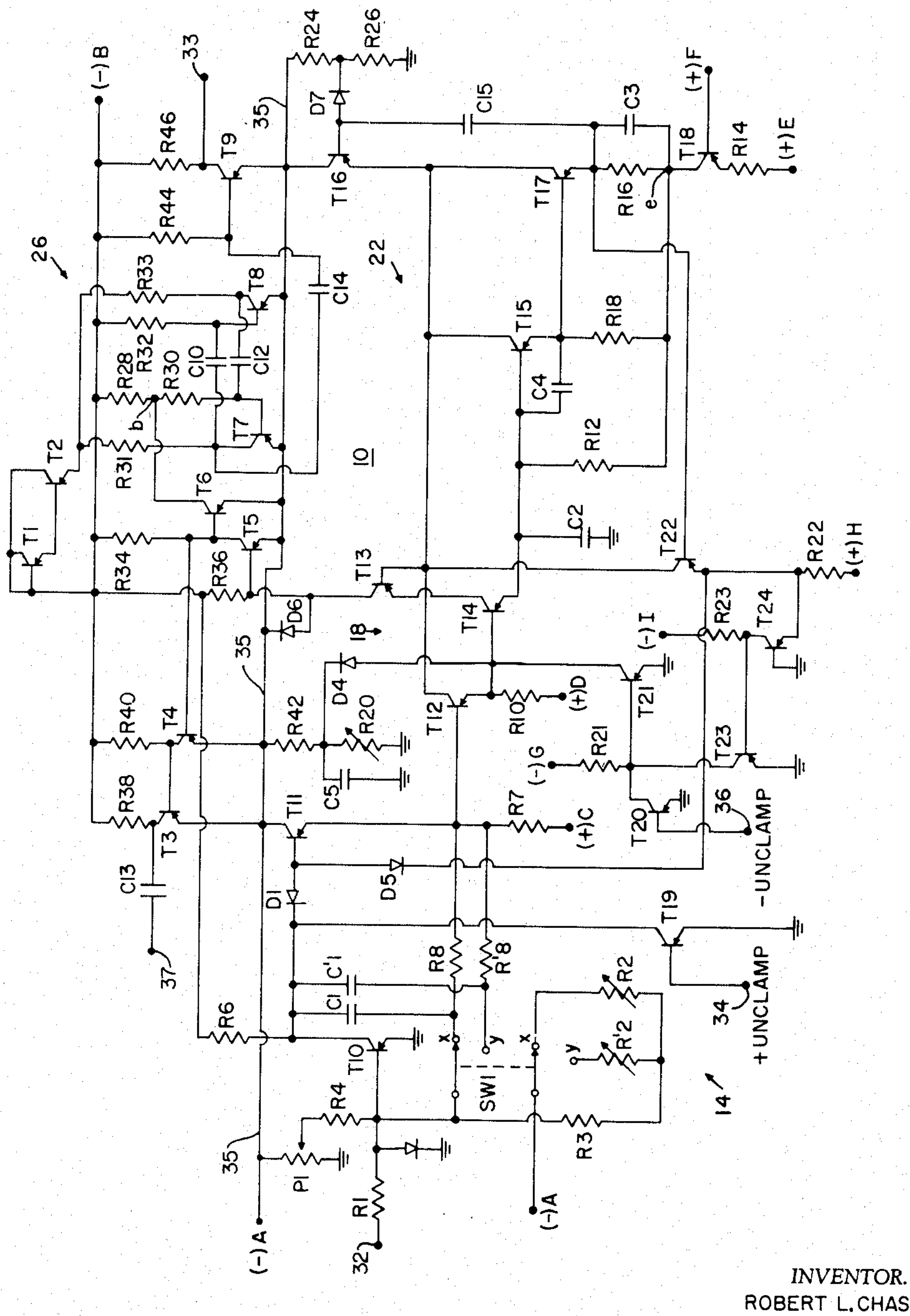
INVENTOR.
ROBERT L. CHASE
BY
Roland A. Anderson
Attorney 3,140,479

TRANSISTORIZED ANALOG-TO-DIGITAL CONVERTER

Robert L. Chase, Blue Point, N.Y., assignor to the United States of America as represented by the United States Atomic Energy Commission Filed Feb. 4, 1960, Ser. No. 6,831
6 Claims. (Cl. 340—347)

This invention relates to transistorized analog-to-digital converters and more particularly to transistorized analog-to-digital converters utilizing height-to-time conversion techniques.

In many electronic applications, it is desirable to convert analog information to digital information for further processing. One popular and convenient method of achieving this result is to use height-to-time conversion techniques. In a typical arrangement a capacitor is charged and is then made to discharge in a time period which is proportional to the maximum voltage which was imposed, and a multi-vibrator circuit is provided which is made to run only during the period the capacitor is discharging. While the capacitor is charging, and after the capacitor has discharged to a predetermined level, the multivibrator is clamped in a non-oscillation state. The output of the latter, in number of pulses, thus gives a digital indication of the maximum amplitude of the input signal to the system.

Conventional circuits of this type generally employ thermionic valves or tubes which, because of their physical size and power consumption requirements, add to the bulk and power requirements of the conversion circuit. In addition to these deficiencies, the characteristics of electronic tubes tend to vary with time and it is difficult to achieve a stable circuit in which the values do not change as the components age.

The present invention provides a new and novel pulse height-to-time conversion circuit of the type described in which semi-conductor type active elements are employed to reduce the physical size and power consumption of the circuit. The novel circuit has the additional advantages of increased reliability and stability due to the use of the transistors in paired arrangements so that there is substantially complete cancellation of the contact potential changes which occur with temperature variations.

It is thus a first object of this invention to provide an analog-to-digital converter utilizing semi-conductor type active elements.

It is another object to provide a transistorized height-to-digital conversion circuit of improved reliability and stability.

A further object of this invention is the provision of a compact and efficient analog-to-digital conversion circuit. Other objects and advantages of this invention will become readily apparent from the following description of a preferred arrangement illustrated in the accompanying drawing.

Referring to the drawing for details of the transistorized pulse-to-height-to-time converter circuit 10, it will be seen that the latter consists of a gated amplifier 14, a capacitor charging circuit 18, a linear rundown circuit 22, and a gated multivibrator circuit 26. The input to converter 10 is on a contact 32 while the pulse output is taken from a contact 33. Amplifier 14 consists of a pair of semiconductors or, more particularly, transistors T10 and T11. The input to amplifier 14 is supplied to the base contact of transistor T10 through a resistor R1. Biasing of the base of transistor T10 is accomplished by a voltage dividing network extending between a −12 volt source A and ground consisting of a switch SW1, resistors R2, R3 and R4 and a potentiometer P1 which has a wiper adjustable for a purpose to be later described. It is understood that the values given are illustrative only and serve the purpose of indicating relationships.

Potentiometer P1 is connected between the −12 volt source A and ground. Double throw two position switch SW1 adjusts feedback on the base of transistor T10 to obtain a gain in its position $x$ of 0.1 with the output voltage covering all of the input range. In position $y$, amplifier 14 covers any 20% portion of the input range with a gain of 0.5, the particular portion being selected by the wiper on potentiometer P1.

The collector of transistor T10 is connected to a −15 volt source B, through a resistor R6 while the emitter thereof is grounded. Transistors T10 and T11 are directly coupled through a diode D1 to prevent reverse current flow. Emitter follower transistor T11 has its collector connected to the −12 volt source A while its emitter is connected to a +12 volt source C through a resistor R7. The output of transistor T11 is connected from its emitter into the base of an emitter follower transistor T12 which will partially balance the contact potential changes in transistor T10 due to temperature variations. Feedback to transistor T10 as mentioned above, is either through a resistor R8 or R'8, depending upon the position of switch SW1 between the bases of the two transistors. A pair of capacitors C1 and C'1 between resistors R8 and R'8, respectively, to the collector of transistor T10 improve the transient response of amplifier 14. A clamping transistor T19 is connected with its collector to the cathode of diode D1 and emitter to ground. A positive unclamping pulse for amplifier 14 is delivered to its base from a contact 34 when it is desired to activate converter 10 as will be later described in connection with the operation of this apparatus.

The emitter of transistor T12 is connected to a +12 volt source D through a resistor R10, while its collector is placed in common connection with the collectors of transistors T15, T17 and T22. The output of transistor T12 is taken from its emitter and delivered to the base of charging transistor T14 which serves a dual purpose to be described below. The emitter of transistor T14 is connected to the collector of a transistor T18 through a large resistor R12 and to ground through a storage condenser C2. The later is charged to a level indicative of the maximum amplitude of the input signal on contact 32 and discharged at a uniform current rate through resistor R12 to permit the delivery of a pulse count proportional to its initial charge, as will be later explained. The collector of transistor T14 is connected to the emitter of a transistor T13. The emitter of transistor T18 is connected to a +17 volt source E through a resistor R14, while its base is connected to a +12 volt source F. Transistor T17 has its emitter connected through a resistor R16 and a large condenser C3 to the collector of transistor T18 while transistor T15 is connected in a similar fashion through a resistor R18. This common point is designated $e$ for convenience. A small bypass condenser C4 is placed across the base and emitter of transistor T15 to suppress oscillations. The emitter of transistor T15 is coupled directly to the base of transistor T17. Transistors T15 and T17 are cascaded so that the base current in transistor T15 is a small fraction of the capacitor C2 discharge current (in one case about 1%), so as not to affect materially the constant discharge of the latter through resistor R12. Furthermore the emitter followers T15 and T17 deliver a nearly constant load current to transistor T18 and the collector voltage is maintained constant by a transistor T16 to be later described. High voltage transistor T16 is connected between source A and the common collector connection to transistors T17, T15, etc. The base of transistor T16 is biased through a diode D7 as illustrated to the point connecting resistors R24 and R26 between source A and ground. A capacitor C15 connected as illustrated is of high value.

A pair of transistors T20 and T23 form a logical OR circuit controlling the operation of a second clamping transistor T21 which alternately clamps and unclamps transistor T14 at its base in a manner to be later described. The emitter of transistor T12 is connected through a diode D4 to ground through a capacitor C5 and a variable resistor R20 in parallel and to the collector of transistor T21. Resistor R20 effectively prevents the base of transistor T14 from going positive. Transistor T20 is connected with its collector to a −12 volt source G through a resistor R21 and its emitter to ground. A negative unclamping pulse would be delivered to its base when it is desired to activate converter 10. Transistor T23 is similarly connected between ground and source G through resistor R21. However, its base input is from the collector of a transistor T24 whose emitter is connected to a +12 volt source H through a resistor R22. The latter's base is grounded while its collector is connected to a −12 volt source I through a resistor R23. Transistor T24 together with a transistor T22 form a differential amplifier with their common emitter being connected through a diode D5 to the base of transistor T11. Transistor T22 has its collector connected to the base of transistor T13 while its base receives its input from the emitter of transistor T17. Transistors T22 and T24 are part of a feedback to insure proper operation of the circuit during the charging and discharging of capacitor C2 as will be later seen.

A pair of transistors T7 and T8 comprise the gated multivibrator circuit 26 for delivering the pulse output of converter 10 on contact 33. The base and collector contacts of transistors T7 and T8 are interconnected by capacitors C10 and C12, respectively. The emitters are connected to the −12 volt source A, while the base of transistor T7 is connected to the −15 volt source B through resistors R28 and R30, and the base of transistor T8 is connected to source B through resistor R32. The collectors of transistors T7 and T8 are connected to source B through transistors T1 and T2 which compensate for temperature effects in the multivibrator transistors T7 and T8. The output of the multivibrator transistors T7 and T8 is taken from the collector of the former and passed through a capacitor C14 to the base of a transistor T9. Blocking and unblocking of multivibrator 26 is exercised at *b* the common point of resistors R28 and R30. This point is connected as shown through transistors T5 and T6 to the collector of transistor T13. The collector of transistor T6 is connected to point *b* while the emitters of both transistors are connected to the −12 volt source A. The collector of transistor T5 is connected to the base of transistor T6 and also to source B through a resistor R34. A resistor R36 is connected between the base of transistor T5 and source B. From the manner in which these transistors are connected, it will be apparent that with transistor T13 on, resistor R36 will draw current and transistor T5 will be non-conducting and transistor T6 will be on, thereby clamping point *b* at some voltage level. Should transistor T13 be turned off, transistor T5 will turn on and transistor T6 will cease to conduct thereby unclamping point *b*.

The base of output transistor T9 is biased through a resistor R44 connected to source B. The output of converter 10 on contact 33 is taken from the collector transistor T9 which is connected to source B through resistor R46.

A pair of cascaded power amplification transistors T3 and T4 are connected as illustrated with their collectors connected through resistors R38 and R40, respectively, to source B and their emitters the −12 volt source A. Transistors T3 and T4 deliver, when multivibrator 26 oscillates, a pulse through a capacitor C13 to a contact 37 where, as will be later seen, it may be used to terminate the negative unclamping pulse on contact 36.

In the operation of converter 10 the latter is initially kept in a nonresponsive state until needed and then is activated by placing proper unclamping pulses simultaneously on contacts 34 and 36. Before such activation occurs however, transistor T19 is conductive (in the absence of a positive unclamping pulse) with the result that the collector of transistor T10 is essentially grounded and hence is not conducting. Transistor T20 is normally not conducting (in the absence of a negative unclamping pulse) since its base and emitter are substantially at ground. Transistor T23 is likewise not conducting for the following reason. The voltage level at the emitter of transistor T17 is slightly positive with respect to ground (as will be later seen) and transistor T22 is not conducting because transistor T24 is conducting and drawing all of the current in resistor R22. As a result, the base of transistor T23 is slightly positive with respect to ground. Consequently, transistor T21 is conducting so that the emitter and base of transistors T12 and T14, respectively, are clamped to ground. With transistor T14 so clamped in a quiescent state, the emitter thereof is only slightly above ground potential and condenser C2 is substantially uncharged. Transistor T18 is in saturation as the combined currents through resistors R12, R18 and R16 are less than the emitter current. The emitters of transistors T15 and T17 are only slightly above ground potential while point *e* is at some voltage level about 12 volts above ground. Capacitor C3 is a high capacity unit and at high frequencies acts effectively as a 12 volt battery as is understood in the art, and functions to keep point *e* always at 12 volts more positive than the emitter of transistor T17. Such a circuit is sometimes referred to as a bootstrap circuit. Current flow from the collector of transistor T14 passes through transistor T13 which is conducting. Transistor T5 is thus not conducting while transistor T6 is conducting and holding point *b* so that multivibrator circuit 26 is clamped into non-oscillation.

When it is desired to activate converter 10 and make the latter responsive to a pulse on input contact 32 to produce a series of pulses on output contact 33, a positive unclamping pulse is inserted on contact 34 to the base of transistor T19 and a negative unclamping pulse is simultaneously placed on contact 36 to the base of transistor T20. This causes transistor T19 to cease conducting and thereby unclamp transistor 11, and transistor T20 to begin conduction thereby terminating conduction in transistor T21 and unclamp the base of transistor T14. As a result, when a positive impulse is applied to contact 32, there will be a decrease in collector current through transistor T10 and a drop in voltage level on the base of transistor T11 causing increasing current in the latter, followed by a drop in the voltage level on the base of transistor T12 and increased current in the latter. There will, accordingly, be a drop in the base voltage of transistor T14, increased current flow in the circuit of the latter causing a drop to a level below ground of the emitter of transistor T14 and the consequent increased negative charge on capacitor C2 to an amount effectively proportional to the amplitude of the signal on contact 32. The duration of the unclamping pulse on contact 34 is just sufficient to pass the incoming signal so that after it is received, transistor T19 will again be conductive and prevent other incoming pulses from interfering with the operation of the circuit. Once the bases of transistors T11, T12 and T14 reach their maximum negative voltages representing the peak of the input signal on contact 36 as described, the circuit will function to hold them at a potential close to the potential of storage capacitor C2 while the latter runs down in a linear fashion. The foregoing action causes a drop in voltage on the emitter of transistor T17 which causes transistor

T22 to turn on and become conductive, drawing emitter current from transistor T24 and cutting the latter off.

Due to a voltage drop on the emitter of T22, diode D5 becomes conductive and in conjunction with diode D1 clamps the base of transistor T11 to hold the base of transistor T14 at its negative peak as the voltage of the input signal drops off from its peak so that the reverse base-to-emitter voltage of T14 is maintained at a small constant value, such as about one volt. The base-emitter reverse leakage current is at a small and constant value. At the same time, with conduction in transistor T24 terminated as noted, transistor T23 turns on, so that when the unclamping pulse on contact 36 terminates when the negative peak of capacitor C2 is reached, transistor T21 will remain off and transistor T14 will continue to be clamped through diode D5. With T14 in a non-conducting state, transistor T13 is off, and transistor T5 turns on thereby turning transistor T6 off and point *b* is unclamped. All of this occurs at the instant capacitor C2 reaches its fully, that is, maximum charged state. Multivibrator 26 then begins to deliver a series of pulses to transistor T9 and contact 33. Transistors T3 and T4 act as power amplifiers delivering a pulse which may be used to terminate the unclamping pulse on contact 34 to render circuit 10 unresponsive to any new signals imposed on contact 32. This feature is optional and is useful under certain circumstances. As already noted, transistor T14 turns off at the exact point when capacitor C2 reaches its peak charge, initiating multivibrator 26 at this time. This synchronism is brought about by the reversal of current flow in capacitor C2 as it begins to discharge resulting in the back biasing of transistor T14 which is maintained through rundown by the feedback arrangement through diode D5 as already explained.

*Table I*

| Element | Resistance | Voltage | Capacitance | Transistor type |
|---|---|---|---|---|
| R1, R14, R34, R40, R44 | 10K | | | |
| R2 | 500K | | | |
| R3 | 51K | | | |
| R4 | 1.2K | | | |
| R6, R24, R28, R46 | 3K | | | |
| R7, R21, R22 | 12K | | | |
| R8, R26, R31, R33 | 1K | | | |
| R'8 | 5.1K | | | |
| R10, R32 | 6.2K | | | |
| R12 | 100K | | | |
| R16 | 47K | | | |
| R18 | 470K | | | |
| R20 | 250 | | | |
| R23 | 24K | | | |
| R30 | 3.3K | | | |
| R36 | 30K | | | |
| R38 | 3.9K | | | |
| R42 | 2K | | | |
| P1 | 200 | | | |
| C2 | | | 2,200 μμf | |
| C3, C15 | | | .1 μf | |
| C1, C4 | | | 50 μμf | |
| C5, C13 | | | 10 μf | |
| C'1 | | | 10 μμf | |
| C10, C12 | | | 200 μμf | |
| A, G, I | | −12 | | |
| B | | −15 | | |
| C, D, F, H | | +12 | | |
| E | | +17 | | |
| T1, T2, T3, T4, T5 | | | | } |
| T6, T7, T8, T9, T12, T14 | | | | } 2N344 |
| T15, T17, T20, T22 | | | | } |
| T10, T11, T13, T16, T21 | | | | 2N501 |
| T18, T19, T23, T24 | | | | 2N140 |

Input range: 0 to +100 volts.
Output switch position *x*: 0 to −10 volts.

Capacitor C2 discharges through resistor R12. Transistor T18 comes out of saturation due to a rise of collector current when C2 becomes charged and current flows from source E through transistor T18, resistor R12 and capacitor C2 to ground (electron flow in opposite direction as capacitor C2 discharges). The voltage drop across resistor R12 is kept at a constant value due to the action of capacitor C3 as previously described. When the voltage level of the emitter of transistor T17 rises to the ground level when C2 is fully discharged transistor T22 will again be turned off transferring its emitter current to that of transistor T24 resulting in the clamping of the base at transistor T14 to ground. Capacitor C2 continues to discharge until further discharge is prevented by current transistor T14. The current in the latter flows through transistor T13 and cuts off transistor T5 allowing T6 to turn on and clamp point *b* once again.

A typical circuit of this type built according to the principles of this invention had the parameters shown in Table I.

The differential non-linearity of the converter given in Table I was measured and found to be within ±3% over a 100 volt input range (10 volts at the rundown capacitor), and the integral non-linearity was within ±0.17%. Over a 10% temperature range the zero level and the slope each changed by about 0.5%.

As many changes could be made in the above construction and many different embodiments could be made without departing from the scope thereof, it is intended that all matter contained in the above description or shown in the accompanying drawing shall be interpreted as illustrative only.

I claim:

1. A height-to-time analog-to-digital converter comprising, in combination, means for receiving and amplifying an input pulse, storage means for being charged to a voltage level substantially proportional to the maximum amplitude of said pulse, semi-conductor means for receiving the amplified signal and delivering a charge in response thereto to said storage means, and means in response to the reaching of a peak charge in said storage means for simultaneously blocking further input pulses and initiating a series of uniformly spaced pulses and the discharge of said storage means at a constant current rate until said storage means reaches its initial state of charge, the number of said spaced pulses thereby being a linear function of the maximum amplitude of said input pulse.

2. A height-to-time analog-to-digital converter comprising, in combination, means for receiving and amplifying an input pulse, semi-conductor means for receiving the amplified pulse and establishing voltage and current levels corresponding to the amplitude of said pulse, capactive storage means connected to said semi-conductor means exposed to said current and being charged thereby to a voltage level substantially proportional to said amplitude, and means in response to the establishment of a charge in said storage means at the maximum input pulse amplitude for clamping said semi-conductor means at the corresponding voltage level and holding same during subsequent rundown of said storage means, said semi-conductor means being rendered non-conductive during said rundown due to back-biasing arising out of the aforesaid clamping, means for permitting the controlled constant current discharge of said storage means, and means for delivering a series of equally-spaced identical pulses during the non-conductive period of said semi-conductor means, the number of said spaced pulses thereby being a linear function of the maximum amplitude of said input pulse.

3. An analog-to-digital converter comprising, in combination, means for receiving and amplifying an input pulse, semi-conductor means for receiving the amplified pulse and establishing voltage and current levels corresponding to the amplitude of said pulse, capacitive storage means connected to said semi-conductor means exposed to said current and being charged thereby to a voltage level substantially proportional to said amplitude, and means feeding back a signal to said amplifying means in response to the charge in said storage means for clamping said semi-conductor means at the peak voltage level and holding same during subsequent rundown of said storage means, said semi-conductor means being rendered non-conductive during said rundown due to back-biasing arising out of the aforesaid clamping, means for permitting the controlled constant current discharge of said storage means, and means for delivering a series of equal-spaced identical pulses during the non-conductive period of said semi-conductor means, the number of said spaced pulses thereby being a linear function of the maximum amplitude of said input pulse.

4. An analog-to-digital converter comprising, in combination, means for receiving and amplifying an input pulse, semi-conductor means for receiving the amplified pulse and establishing voltage and current levels corresponding to the amplitude of said pulse, capacitive storage means connected to said semi-conductor means exposed to said current and being charged thereby to a voltage level substantially proportional to said amplitude, feedback means comprising a transistor which switches from the non-conductive state to the conducting state in response to the establishment of a charge in said storage means due to the presence of an input pulse, the latter said means acting in response to the switching on of said transistor for feeding back a signal to said amplifying means for clamping the latter in at the maximum voltage swing due to said pulse and holding same during subsequent rundown of said storage means, said semi-conductor means following said amplifying means and being rendered non-conductive during said rundown due to back-biasing arising out of the aforesaid clamping, means for permitting the controlled constant current discharge of said storage means, said transistor switching back to the non-conductive state after discharge of said storage means is complete, followed by said feedback means unclamping said amplifying means and permitting the return of said semi-conductor means to its conductive state prior to receipt of said input pulse, and means for delivering a series of equally-spaced identical pulses during the non-conductive period of said semi-conductor means, the number of said spaced pulses thereby being a linear function of the maximum amplitude of said input pulse.

5. An analog-to-digital converter comprising, in combination, means comprising transistor active elements for receiving and amplifying an input pulse, semi-conductor means for receiving the amplified pulse and establishing voltage and current levels corresponding to the amplitude of said pulse, capacitive storage means connected to said semi-conductor means exposed to said current and being charged thereby to a voltage level substantially proportional to said amplitude, feedback means comprising a transistor which switches from the non-conductive state to the conducting state in response to the establishment of a charge in said storage means due to the presence of an input pulse, the later said means acting in response to the switching on of said transistor for feeding back a signal to said amplifying means for clamping at least one of said transistor active elements in at the maximum voltage swing due to said pulse and holding same during subsequent rundown of said storage means, said semi-conductor means following said amplifying means and being rendered non-conductive during said rundown due to back-biasing arising out of the aforesaid clamping, means for permitting the controlled constant current discharge of said storage means, said transistor switching back to the non-conductive state after discharge of said storage means is complete followed by said feedback means unclamping said amplifying means and permitting the return of said semi-conductor means to its conductive state prior to receipt of said input pulse, and means for delivering a series of equally spaced identical pulses during the non-conductive period of said semi-conductor means, the number of said spaced pulses thereby being a linear function of the maximum amplitude of said input pulse.

6. An analog-to-digital converter comprising, in combination, means for receiving and amplifying input pulses, semi-conductor means for receiving the amplified pulses and establishing voltage and current levels corresponding to the amplitude of said pulses, capacitive storage means connected to said semi-conductor means exposed to said current and being charged thereby to a voltage level substantially proportional to said amplitudes, first clamping means connected to said amplifying means for holding the latter in a state unresponsive to said input pulses, second clamping means connected to said semi-conductor means for holding the latter in a quiescent state and said storage means in substantially an uncharged state, means for applying simultaneous unclamping pulses to said first and second clamping means for rendering said amplifying means responsive to input pulses and said semi-conductor means responsive to the output of said amplifying means to charge said storage means as aforesaid, feed back means in response to the charging of said storage means for maintaining said second clamping means inactive after termination of its unclamping pulse, the latter said feedback means also supplying a signal in response to the charging of said storage means to said amplifying means to clamp the latter in at the peak voltage level reached by a particular input pulse said feed back means becoming ineffective after said storage means becomes fully discharged, said semi-conductor means being rendered non-conductive during said storage means rundown due to back-biasing arising out of the aforesaid clamping of said amplifying means, means responsive to the termination of conduction in said semi-conductor means for discharging said storage means at a controlled rate and means for delivering a series of equally-spaced identical pulses during the non-conductive period of said semi-conductor means, the number of said spaced pulses thereby being a linear function of the maximum amplitude of said particular input pulse.

References Cited in the file of this patent

UNITED STATES PATENTS

| | | |
|---|---|---|
| 2,835,868 | Lindesmith | May 20, 1958 |
| 2,869,079 | Staffin et al. | Jan. 13, 1959 |
| 2,979,708 | Jorgensen | Apr. 11, 1961 |